United States Patent
Kolbe et al.

(10) Patent No.: US 8,939,787 B2
(45) Date of Patent: Jan. 27, 2015

(54) DUAL MATERIAL GROUND CLIP FOR A BUSWAY PLUG IN UNIT

(71) Applicant: Schneider Electric USA, Inc., Palatine, IL (US)

(72) Inventors: Nathan E. Kolbe, Lebanon, TN (US); James R. Ramsey, Murfreesboro, TN (US)

(73) Assignee: Schneider Electric USA, Inc., Palatine, IL (US)

( * ) Notice: Subject to any disclaimer, the term of this patent is extended or adjusted under 35 U.S.C. 154(b) by 62 days.

(21) Appl. No.: 13/676,955

(22) Filed: Nov. 14, 2012

(65) Prior Publication Data

US 2014/0134855 A1     May 15, 2014

Related U.S. Application Data

(60) Provisional application No. 61/693,604, filed on Aug. 27, 2012.

(51) Int. Cl.
| | |
|---|---|
| *H01R 11/20* | (2006.01) |
| *H01R 13/648* | (2006.01) |
| *H01R 4/26* | (2006.01) |
| *H01R 4/64* | (2006.01) |

(52) U.S. Cl.
CPC .............. *H01R 13/648* (2013.01); *H01R 4/26* (2013.01); *H01R 4/64* (2013.01)
USPC .......................................... 439/387; 439/839

(58) Field of Classification Search
USPC ................................................ 439/839, 387
See application file for complete search history.

(56) References Cited

U.S. PATENT DOCUMENTS

| | | | | |
|---|---|---|---|---|
| 2,654,076 | A | * | 9/1953 | O'Callaghan, Jr. ............ 439/727 |
| 3,152,857 | A | * | 10/1964 | Fisher ............................ 439/839 |
| 3,497,860 | A | | 2/1970 | Jorgensen et al. |
| 3,627,900 | A | * | 12/1971 | Robinson ..................... 174/11 R |
| 4,040,713 | A | * | 8/1977 | Konnemann .................. 439/839 |
| 4,219,252 | A | * | 8/1980 | Fischer ......................... 439/839 |
| 4,351,583 | A | * | 9/1982 | Belttary ........................ 439/839 |
| 4,406,505 | A | | 9/1983 | Avramovich |
| 4,583,812 | A | * | 4/1986 | Gross et al. .................. 439/839 |
| 4,983,132 | A | * | 1/1991 | Weidler ........................ 439/786 |
| 4,993,959 | A | | 2/1991 | Randolph |
| 5,064,379 | A | * | 11/1991 | Ryll et al. ....................... 439/81 |
| 5,928,006 | A | * | 7/1999 | Franks, Jr. ..................... 439/92 |
| 6,024,611 | A | * | 2/2000 | Giuseppe ..................... 439/819 |

(Continued)

FOREIGN PATENT DOCUMENTS

GB     1213737     11/1970

OTHER PUBLICATIONS

International Search Report for International App. No. PCT/US2013/051197—Date of Completion of Search: Oct. 7, 2013—4 pages.

(Continued)

*Primary Examiner* — Ross Gushi
(74) *Attorney, Agent, or Firm* — Locke Lord LLP

(57) ABSTRACT

A ground clip for a PIU of a busway system has a two part assembly made with two different materials, a first hard material designed to remove dielectric coating on the busway section and a second highly conductive material to establish necessary electrical contact, cooperating together as the PIU is installed on the busway case to establish a reliable ground automatically and without tools.

19 Claims, 4 Drawing Sheets

(56) References Cited

U.S. PATENT DOCUMENTS

| | | | |
|---|---|---|---|
| 6,357,089 B1* | 3/2002 | Koguchi et al. | 24/536 |
| 6,361,352 B2* | 3/2002 | Barrat et al. | 439/395 |
| 6,659,783 B2* | 12/2003 | Copper et al. | 439/181 |
| 6,692,316 B2* | 2/2004 | Hsieh et al. | 439/845 |
| 6,722,926 B2* | 4/2004 | Chevassus-More | 439/721 |
| 7,025,634 B1* | 4/2006 | Swantner et al. | 439/619 |
| 7,094,113 B1* | 8/2006 | Hasenour et al. | 439/709 |
| 7,549,889 B2* | 6/2009 | Sikora | 439/388 |
| 7,581,972 B2* | 9/2009 | Daamen | 439/249 |
| 7,766,706 B2* | 8/2010 | Kawamura et al. | 439/839 |
| 7,794,265 B2* | 9/2010 | Sikora | 439/388 |
| 7,876,193 B2* | 1/2011 | Pavlovic et al. | 337/229 |
| 7,892,050 B2* | 2/2011 | Pavlovic et al. | 439/839 |
| 7,993,156 B2* | 8/2011 | Holste | 439/441 |
| 8,182,299 B2* | 5/2012 | Schrader | 439/857 |
| 8,366,497 B2* | 2/2013 | Glick et al. | 439/839 |
| 8,388,389 B2* | 3/2013 | Costello et al. | 439/839 |
| 8,419,486 B2* | 4/2013 | Tyler | 439/842 |
| 8,475,220 B2* | 7/2013 | Glick et al. | 439/839 |
| 2001/0014552 A1* | 8/2001 | Barrat et al. | 439/406 |
| 2004/0040733 A1* | 3/2004 | Yuasa et al. | 174/68.2 |
| 2008/0132103 A1* | 6/2008 | Osada et al. | 439/278 |
| 2008/0146091 A1* | 6/2008 | Tyler | 439/843 |
| 2008/0274639 A1* | 11/2008 | Sikora | 439/522 |
| 2009/0186515 A1* | 7/2009 | Sikora | 439/388 |
| 2010/0173531 A1* | 7/2010 | Holste | 439/700 |
| 2010/0311286 A1* | 12/2010 | Schrader | 439/839 |
| 2010/0323563 A1* | 12/2010 | Pavlovic et al. | 439/839 |
| 2011/0028051 A1* | 2/2011 | Heigl et al. | 439/736 |
| 2011/0076901 A1* | 3/2011 | Glick et al. | 439/839 |
| 2012/0129407 A1* | 5/2012 | Glick et al. | 439/817 |
| 2013/0012072 A1* | 1/2013 | Costello et al. | 439/660 |
| 2013/0273786 A1* | 10/2013 | Ahangar et al. | 439/786 |
| 2014/0014163 A1* | 1/2014 | McCarthy et al. | 136/251 |

OTHER PUBLICATIONS

PCT Written Opinion of the International Searching Authority for International App. No. PCT/US2013/051197—Date of Completion of Search: Oct. 7, 2013—7 pages.

* cited by examiner

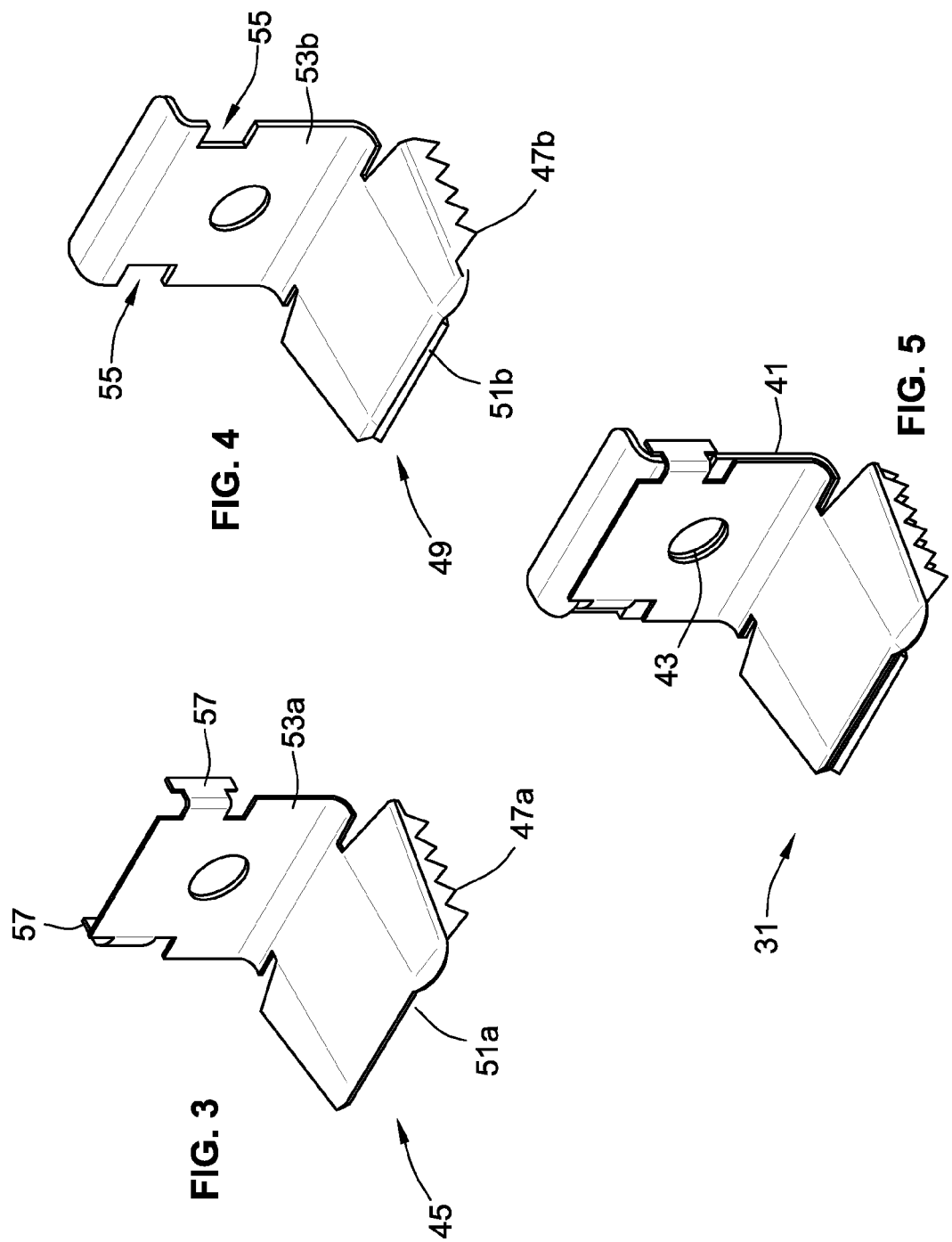

DUAL MATERIAL GROUND CLIP FOR A BUSWAY PLUG IN UNIT

CROSS REFERENCE TO RELATED APPLICATIONS

This application claims priority to U.S. provisional application 61/693,604 filed Aug. 27, 2012.

FIELD OF THE INVENTION

The present invention relates generally to electrical distribution equipment and, more particularly, to plug in units for busway structures.

BACKGROUND OF THE INVENTION

A busway system is a power delivery structure for industrial facilities comprising prefabricated sections for delivery and control of large amounts of electrical power. A busway system typically includes two or more linear busway sections of large, protectively encased, conductive busses; joint packs for electrically and mechanically connecting the linear busway sections together, and multiple plug-in units for power take off, control, and the like. Each busway section includes one or more phase-conductors and a housing. For example, in a three-phase system, the busway section can include three live phase-conductors or three live phase-conductors and one or two neutral-conductors, depending on the type of system architecture being employed. Where required, various plug-in units (sometimes abbreviated PIU) carrying the required electrical components can be directly connected to one or more specially adapted plug-in connection sites spaced along the busway sections to draw power. Each plug in unit must therefore physically and electrically connect to the busway sections to be operational.

One part of this electrical and mechanical connection is a ground connection from the plug in unit to the chosen busway section. In the past some busway plug-in units have used a copper clip to ground the plug-in enclosure to the bare aluminum case of the busway. The ground clip is electrically and physically connected as a part of the PIU assembly to place the case of the PIU at the same potential as the case of the busway when the PIU is attached to the busway.

SUMMARY OF THE INVENTION

In instances where the protective busway case is anodized, painted, or otherwise coated, a single piece copper ground clip has no effective means to remove the coating and make good contact as the PIU is installed on the coated busway. Thus, a need exists for an effective way of accomplishing the grounding connection when placing the plug in unit on coated busway. The present disclosure is directed to satisfying this need.

In some aspects, the present invention may include a ground clip comprising a two part assembly made with two different materials, a first hard material designed to remove the busway coating and a second highly conductive material to establish necessary electrical contact, cooperating together as the PIU is installed on the busway case.

An active cutting portion of the ground clip has teeth of hard material such as stainless steel to remove paint or anodizing from the busway case as the PIU is installed. A high conductivity clip of softer material such as copper is adjacent to the cutting teeth and preferably has its own teeth. The ground clip is electrically and physically connected at one or more of its portions to the PIU casing. In one aspect of the invention the ground clip is a two part assembly of overlapping, or nesting, clip elements. The clip elements are fastenable to each other and the entire ground clip assembly can be fastened to the PIU. The copper clip is preferably nested under the stainless steel clip so that the copper makes contact with the aluminum of the busway casing that is uncovered, i.e. cleaned of dielectric coating, by the abrasive or cutting action of the stainless steel clip on the busway casing during the plug-in process. The placement of the cutting teeth is such that a strip of busway coating is cleared under each side of the clip as the PIU is installed on the busway. The cutting teeth of the stainless steel clip can be placed on an angle to the ground clip's intended direction of travel in engaging the busway case. Thus, a wider furrow in the busway coating is created for the soft, highly conductive copper as the nested copper conducting clip follows in the cleared path to make the ground connection with the busway.

The length relationship between the copper teeth and the stainless steel teeth is designed to allow the copper to wear slightly as the PIU is installed and removed repeatedly. The stainless clip will not wear down and prevents the copper from wearing beyond the point of effectively making contact. The grounding clip assembly provides repeated plug-in cycles with good ground contact between the PIU and busway.

Preferably, the pieces of the assembly are held together using a notch and locking tab design. In one embodiment a copper portion has notches on the sides and a stainless steel clip has tabs that bend in place around the notches. This allows the two part clip to be installed as a single unit in the PIU thus eliminating the possibility of the operator missing one of the clips during assembly.

Once installed, the ground clip of the present invention provides grounding between the PIU and busway without tools. The new ground clip assembly removes busway coatings, automatically providing good grounding contact between the PIU and busway, and is compatible with existing busway structures.

BRIEF DESCRIPTION OF THE DRAWINGS

The foregoing and other advantages of the invention will become apparent upon reading the following detailed description and upon reference to the drawings.

FIG. 3 is a perspective view of a first clip structure of a two part ground clip assembly;

FIG. 4 is a perspective view of a second clip structure of a two part ground clip assembly;

FIG. 5 is a perspective view of an assembled ground clip assembly;

DETAILED DESCRIPTION OF THE ILLUSTRATED EMBODIMENTS

Although the invention will be described in connection with certain aspects and/or embodiments, it will be understood that the invention is not limited to those particular aspects and/or embodiments. On the contrary, the invention is intended to cover all alternatives, modifications, and equivalent arrangements as may be included within the spirit and scope of the invention as defined by the appended claims.

Figure 1:
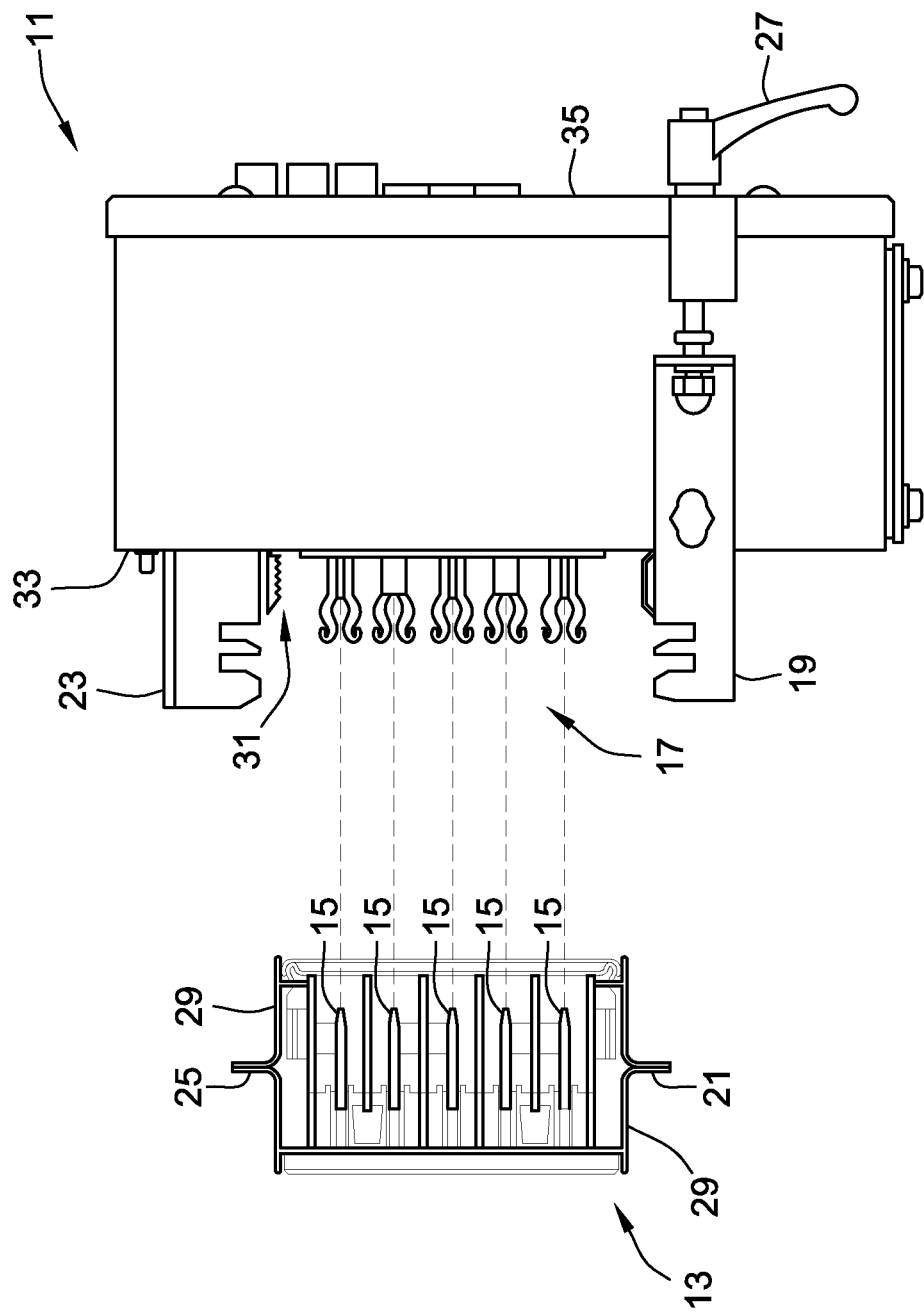
FIG. 1 is a partial cutaway side view of a busway section and accompanying PIU according to aspects of the present invention.

Referring to FIG. 1, there is shown a plug in unit (PIU) 11 in side view adjacent a section of busway 13 shown in end view and partial cutaway to show the conductive stabs collectively 15 arranged to accept the electrical connectors collectively 17 of the PIU 11.

The busway conductors and their stabs 15 are contained within the busway case 29. As known to those in the art, the PIU may for example provide a power branch with one or more of fusing, switches, circuit breakers, and power outlets. To connect the illustrated PIU 11, its lower hanger 19 is pivoted down, out of the way of the busway lower flange 21. The PIU upper hanger 23 is then hung over the busway upper flange 25 and the PIU swung, typically through an arc, until its connectors 17 are securely engaged with the busway stabs 15. The PIU lower hanger 19 is then swung into place over the lower busway flange 21 and tightened in place by operation of the handle 27.

During the placement of the PIU 11 onto the busway 13, a ground clip 31 secured at the back surface 33 of the PIU operates to engage the case 29 of the busway 13 to insure that the PIU and the busway case are at the same potential, which is typically ground. In the common instance where the metal of the busway case 29 has been painted, anodized or otherwise protected, it is important to insure that a good electrical connection is made between the grounding clip 31 and the busway case 29. It is further desirable that the electrical connection happen automatically and without tools during the PIU installation.

Figure 2:
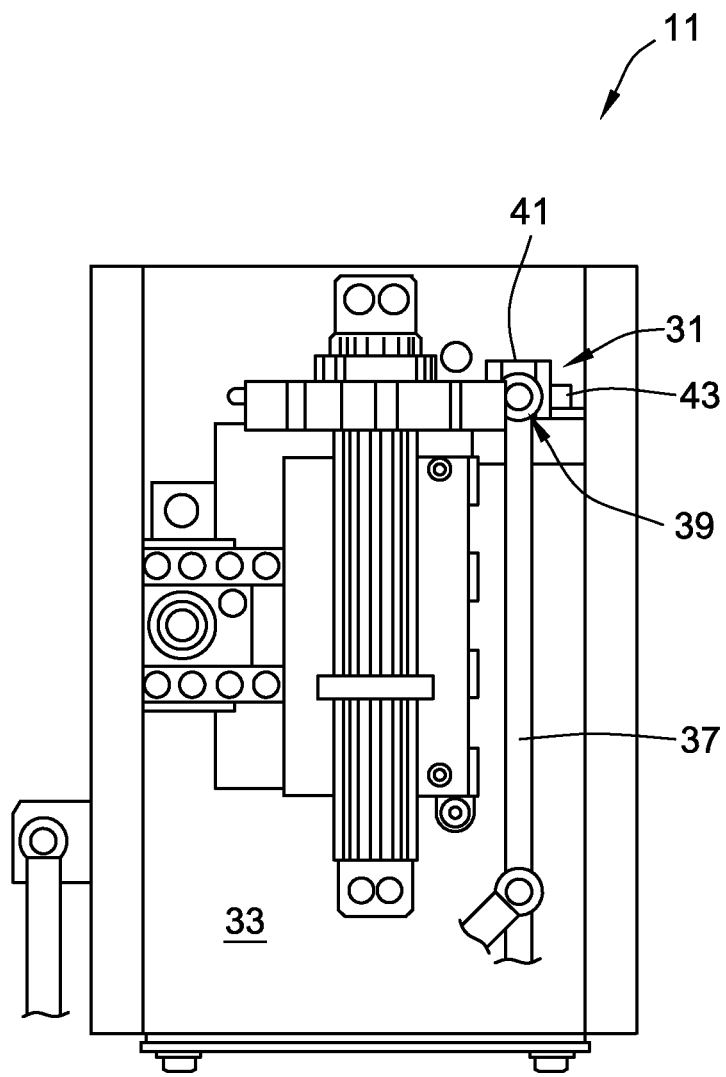
FIG. 2 is a front view of a PIU with the door removed to show the interior.

In FIG. 2, a front view of a PIU 11 is shown with its front door 35 (FIG. 1) removed to show the interior and a ground strap 37 to which the ground clip 31 is fastened by a tenacious fastener such as a bolt 39 or the like. In the illustrated embodiment of FIG. 2, the ground clip 31 is installed in the PIU from the inside with one ground clip portion 41 resting parallel to the interior back wall 33 and a second ground clip portion (not shown) protruding thru an aperture 43 in the back wall 33 to contact the busway case, as further explained below. It will be appreciated that different fastening arrangements and locations of the components might be utilized.

Figure 6:
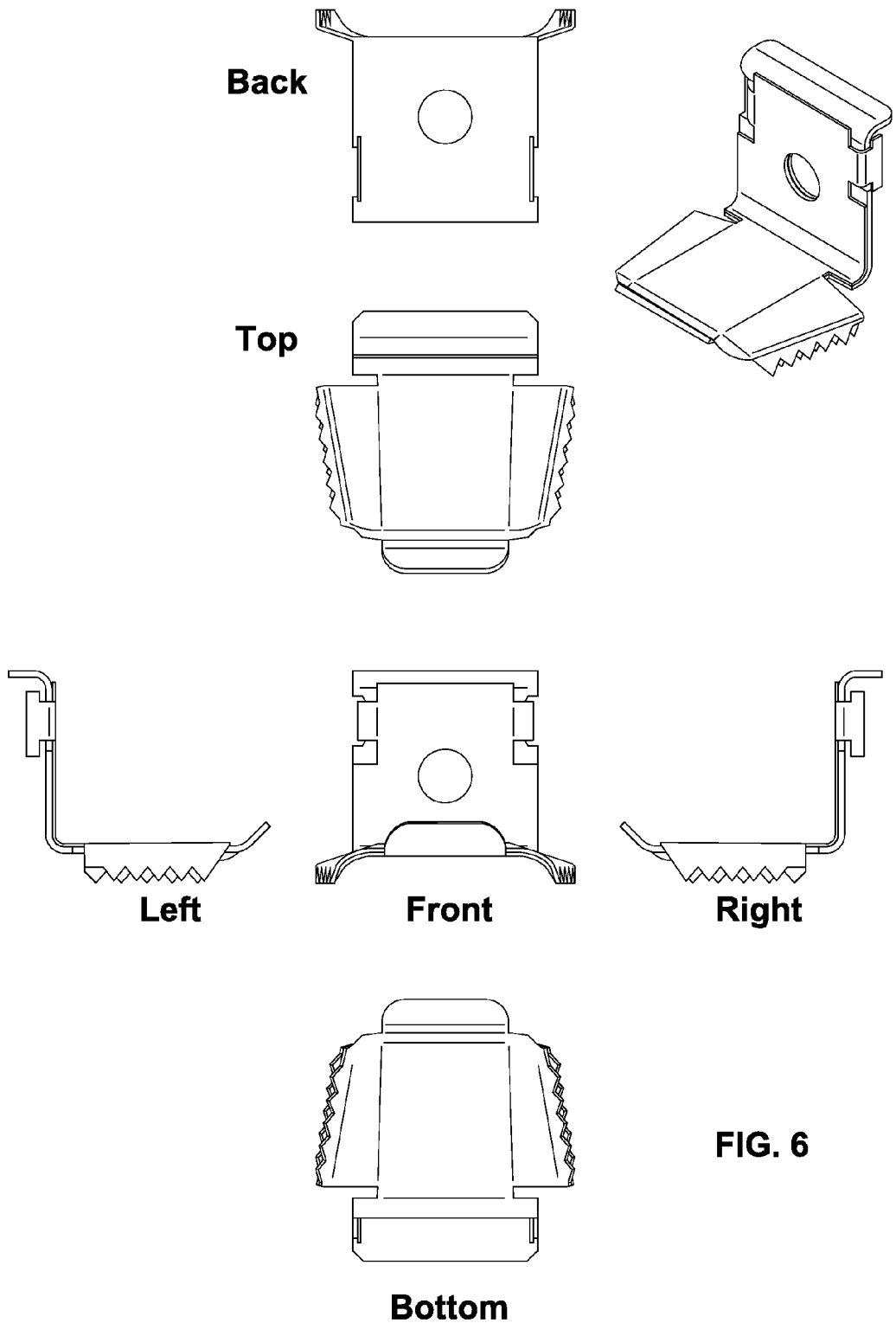
FIG. 6 is an engineering drawing of an assembled ground clip assembly showing elevation, plan, and projection views of an assembled ground clip assembly.

Referring also to FIGS. 3-5, the ground clip 31 is preferably a two part assembly made with two different materials, including a first clip structure 45 (FIG. 3) of a hard material, such as stainless steel, having at least one tooth, or preferably a row, or rows best seen in FIG. 6, of teeth 47, designed to remove a busway section coating. A second clip structure 49 (FIG. 4) of a highly conductive material, such as copper, which is softer than steel and the coated busway casing, is then in place to establish necessary electrical contact with metal underlying the busway coating. It will be appreciated that various materials and compositions for the clip may be selected but generally the high conductivity material of the second clip structure will be softer than the cutting material of the first clip structure.

Each clip structure 45, 49 has an overlapping area of the clip 31 which is adapted to receive a fastener, here providing an aperture 43 through the back portion of the clip for receiving a bolt, (not shown) and connecting the ground clip 31 tenaciously to the PIU. Each clip structure 45, 49 has two perpendicular and generally planar portions which can generally be described as the toothed portions, respectively 51a, 51b, and the non-toothed, or back, portions 53a, 53b. As better seen in the views of FIG. 6, each clip structure 45, 49 has a row of downward facing teeth, respectively 47a, 47b, along each of two sides, of its toothed planar portions 51a, 51b. With reference to the grounding clip 31 alone, it can be seen that the illustrated embodiment presents a center axis, or plane, of bilateral symmetry for the grounding clip 31. The teeth rows 47a, 47b are angled to that center plane, such that the leading tooth is closer to the plane than each following tooth. Functionally then, the row or rows of teeth 47a, 47b are placed at an angle to the ground clip's intended direction of travel when engaging the busway case 29. Thus, the cutting edge of the hard first clip structure 45 is formed by multiple teeth 47b during travel against the case, and a wider furrow is created for the soft, highly conductive teeth 47b of the second clip structure 49 to contact the bare metal. For brevity's sake, this arrangement will be referred to as "offset teeth."

As seen in FIGS. 5 and 6 the complete ground clip 31 is a two part assembly of overlapping clip elements wherein the second clip structure 49 is nested under the first clip structure 45 thus placing the second clip structure teeth 47b adjacent to the cutting teeth 47a of the first clip structure. The first clip structure 45 and the second clip structure 49 are fastenable to each other to make a ground clip assembly which can be fastened to the PIU. The generally conformable clip structures of the preferred assembly are held together using a notch and tab design located on their back portions 53a, 53b wherein the second clip structure 49 has notches 55 on the sides and the first clip structure has tabs 57 that are bendable into the notches.

While particular aspects, embodiments, and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A ground clip for a PIU comprising:
a two part assembly made with two different materials, including
a first clip structure of a hard material having a row of teeth designed to remove a busway section coating, wherein each tooth on the row of teeth, in succession, along an intended direction of travel of the first clip when engaging a busway case, is farther away from a plane of bi-lateral symmetry of the first clip, and
a second clip structure of a highly conductive material to establish necessary electrical contact with metal underlying the busway coating.

2. The ground clip for a PIU according to claim 1 an area of the clip being adapted to receive a fastener for connecting the ground clip to a PIU.

3. The ground clip for a PIU according to claim 1 wherein the first clip structure has cutting teeth to remove coating from the busway case.

4. The ground clip for a PIU according to claim 3 wherein the second clip structure has teeth adjacent to the cutting teeth of the first clip structure.

5. The ground clip for a PIU according to claim 1 wherein each clip structure has two perpendicular and generally planar portions.

6. The ground clip for a PIU according to claim 5 wherein each clip structure has a row of offset teeth along two edges of one of its planar portions.

7. The ground clip for a PIU according to claim 5 wherein the ground clip is a two part assembly of overlapping clip elements.

8. The ground clip for a PIU according to claim 7 wherein the first clip structure and the second clip structure are fastenable to each other to make a ground clip assembly which can be fastened to the PIU.

9. The ground clip for a PIU according to claim 8 wherein the second clip structure is nested under the first clip structure.

10. The ground clip for a PIU according to claim 9 wherein the pieces of the assembly are held together using a notch and tab design.

11. The ground clip for a PIU according to claim 10 wherein the second clip structure has notches on the sides and the first clip structure has tabs that are bendable into the notches.

12. The ground clip for a PIU according to claim 1 wherein the hard material is steel.

13. The ground clip for a PIU according to claim 1 wherein the high conductivity material of the second clip structure is softer than the material of the first clip structure.

14. The ground clip for a PIU according to claim 13 wherein the softer material is copper.

15. A PIU having a housing, and having a ground clip comprising
a two part assembly made with two different materials, including
a first clip structure of steel having a tooth designed to remove a busway section coating, and
a second clip structure of copper having a tooth designed to establish necessary electrical contact with metal underlying the busway coating,
wherein each clip structure has two perpendicular and generally planar portions placed in a nesting configuration, and
the ground clip being electrically and physically connected and tenaciously engaged to the PIU housing.

16. A busway system including a busway section having a coated casing and a PIU attached to the busway section, the PIU having a housing and having a ground clip and comprising
a two part assembly made with two different materials, including
a first clip structure of a hard material having a tooth designed to remove a busway section coating, and
a second clip structure of highly conductive material having a tooth designed to establish necessary electrical contact with metal underlying the busway coating,
wherein each clip structure has two perpendicular and generally planar portions placed in a nesting configuration, and
the ground clip being electrically and physically connected and tenaciously engaged to the PIU housing, and
wherein the second clip structure is nested under the first clip structure so that the conductive material makes contact with uncoated metal of the busway casing that is uncovered by the tooth of the first clip structure acting on the busway casing during the plug-in process.

17. The busway system according to claim 16 wherein each clip structure has a row of offset teeth.

18. The busway system according to claim 17 wherein the length relationship between the copper teeth and the stainless steel teeth is designed to allow the copper to wear slightly as the PIU is installed and removed repeatedly.

19. The busway system according to claim 18 wherein a wear rate of the first clip structure prevents the second clip structure from wearing beyond a point of effectively making contact with the uncovered busway casing.

* * * * *